United States Patent

Matsuda

[11] Patent Number: 5,574,311
[45] Date of Patent: Nov. 12, 1996

[54] DEVICE HAVING PINS FORMED OF HARDENED MIXTURE OF CONDUCTIVE METAL PARTICLE AND RESIN

[75] Inventor: Tatsuharu Matsuda, Kawasaki, Japan

[73] Assignee: Fujitsu Limited, Kawasaki, Japan

[21] Appl. No.: 350,986

[22] Filed: Nov. 29, 1994

[30] Foreign Application Priority Data

Jan. 28, 1994 [JP] Japan ................................ 6-008848

[51] Int. Cl.⁶ ............................................. H01L 23/498
[52] U.S. Cl. ........................... 257/697; 257/741; 257/773
[58] Field of Search .................................... 257/692, 697, 257/741, 773

[56] References Cited

U.S. PATENT DOCUMENTS 4,724,472  2/1988  Sugimoto et al. ..................... 257/697

FOREIGN PATENT DOCUMENTS

1-136357  5/1989  Japan ..................................... 257/697
2-35764   2/1990  Japan ..................................... 257/697

Primary Examiner—Steven H. Loke
Assistant Examiner—Roy Potter
Attorney, Agent, or Firm—Armstrong, Westerman, Hattori, McLeland & Naughton

[57] ABSTRACT

An electrode-pin forming mask is used to form electrode pins on the semiconductor chip. The electrode-pin forming mask has electrode-pin forming holes matching electrode pads previously formed on the semiconductor chip. A screen-printing technique is used to form the electrode pins on the semiconductor chip through the electrode-pin forming mask. That is, conductive material in a paste state is pushed into the electrode-pin forming holes in a condition where the electrode-pin forming mask has been placed on the semiconductor chip and positions of the electrode-pin forming holes match positions of the electrode pads of the semiconductor chip, respectively. The conductor material thus pushed into the electrode-pin forming holes is thus shaped as to form the electrode pins projecting from the electrode pads of the semiconductor chip. Then, the electrode-pin forming mask is removed from the semiconductor chip while the thus shaped conductor material continues to be projected from the electrode pads of the semiconductor chip. Thus, the electrode pins are formed on the semiconductor chip.

7 Claims, 7 Drawing Sheets

DEVICE HAVING PINS FORMED OF HARDENED MIXTURE OF CONDUCTIVE METAL PARTICLE AND RESIN

BACKGROUND OF THE INVENTION

1. Field of the Invention

The present invention relates to a method for manufacturing a semiconductor device having a step of forming electrode pins (pin-shaped electrodes) on a semiconductor chip using an electrode-pin forming mask, the semiconductor device, the electrode-pin forming mask and a method for testing the semiconductor chip using the electrode-pin forming mask, all of which can be suitably applied to a flip-chip-bonding mounting method, or the like.

Recently, a computer system which is miniaturized, capable of a high-speed operation performance, and has a high mounting density has been demanded by the public. As a result, it is required that a manufacturing technique enabling realization of a fine-pitch multi-electrode-pin arrangement in a semiconductor device be established in order to achieve miniaturization of semiconductor devices. Further, it is necessary that costs required for achieving the above demands be kept low. The above-mentioned fine-pitch multi-electrode-pin arrangement in a semiconductor device is an arrangement in which many electrode pins are finely arranged in a semiconductor device.

Mounting methods for fulfilling such demands, that is, a flip-chip-bonding mounting method and TAB (tape-automated-bonding) mounting method, have been made practicable. In these methods, it is necessary to previously form projecting electrodes on a semiconductor chip. Various construction types of such projecting electrodes have been proposed. One of the construction types is an electrode-pin type. The electrode-pin type of projecting electrodes is formed of micro-pins and will be referred to as electrode pins. In order to miniaturize semiconductor devices and also to keep the costs thereof low, it is necessary to form such electrode pins with high accuracy on the semiconductor chips and at a low cost.

2. Related Art

In the flip-chip-bonding mounting method using the electrode pins in the related art, a semiconductor chip is mounted on a mounting substrate by forming electron pads on either one of the semiconductor chip and the mounting substrate. On the pads, electrode pins are formed vertically and the thus formed electrode pins are bonded with the other one of the semiconductor chip and the mounting substrate. A wire-bonding method or a jig-used method is, in general, used for the formation of electrode pins on the pads.

The wire-bonding method will now be described. A wire-bonding apparatus is used in the method. One end of each of a number of gold wires is bonded on a respective one of the electrode pads formed on either one of the semiconductor chip and mounting substrate. Then, capillaries for supplying the gold wires are moved away from the electrode pads vertically by a predetermined distance so as to make each of the gold wires stand vertically on the electrode pads. Then, a spark rod is used to spark-cut the gold wires so that vertically standing gold wires remain on the electrode pads. The thus remaining gold wires are the electrode pins. Instead of using the spark rod, it is also possible to use a wedge to cut the gold wires.

The above-mentioned jig-used method (which may be referred to as 'jig-used electrode-pin-forming method', hereinafter) will now be described Previously, a number of electrode pins having a necessary length are manufactured and a jig is prepared. The jig has inserting-holes formed therein so that each of the positions of the inserting-holes therein can match a respective one of the electrode pads on which the electrode pins will be vertically formed. Then, the jig is loaded on either one of the semiconductor chip or mounting substrate, on which one the electrode pads were previously formed. The loading is performed so that each of the positions of the inserting holes of the jig matches a respective one of the electrode pads. Then, the previously manufactured number of electrode pins are put on the jig and the jig is vibrated using a vibration-applying machine, or the like. The vibration of the jig causes electrode pins put on the jig to be inserted into the inserting holes of the jig. Then, after all of the inserting holes have the electrode pins inserted therein, a heating process is performed on the electrode pins so that the electrode pins are heat-bonded on the electrode pads. Then, by removing the jig from the above-mentioned either one of the semiconductor chip and mounting substrate, the electrode pins remain vertically standing on the electrode pads.

Further, a testing step is included in the semiconductor device manufacturing process, the testing step testing whether or not the manufactured semiconductor chip performs predetermined operations. The testing step uses a testing apparatus, probe pins provided in the testing apparatus coming into contact with the electrode pins formed on the electrode pads so as to establish an electric contact between the probe pins and the electrode pins. The testing apparatus supplies a power source and testing signals to the semiconductor chip through the thus established electric contact. Thus, the above-mentioned testing of the semiconductor chip is performed.

There are problems in the above-mentioned semiconductor device manufacturing method. Specifically, in the above-described wire-bonding method, a gold wire is bonded on each of the electrode pads as described above. The number of the electrode pads provided is large to realize the above-mentioned fine-pitch multi-electrode-pin arrangement in the semiconductor device and thus much time is required for the relevant wire-bonding process. Therefore, production efficiency in the semiconductor device manufacturing using the wire-bonding method is low. Further, the length of the electrode pins depends on how long each of the gold wires is cut in the wire-bonding method. However, in the gold-wire cutting, the spark rod or wedge is used. Thus, accuracy with which the gold-wires are cut is low. As a result, the thus cut electrode pins formed on the electrode pads have lengths (heights) different from one another. Such electrode pins having different lengths may not ensure that electric contact is made between the electrode pins and other electrodes when the semiconductor chip is mounted on the mounting substrate.

Further, in realization of the above-mentioned fine-pitch multi-electrode-pin arrangement in the semiconductor device, the above-described jig-used electrode-pin-forming method is problematic. That is, it is not easy to actually insert the electrode pins in all of the inserting holes formed in the jig since it is necessary that each of the electrode pins consists of a small-diameter micro-pin to realize the above-mentioned fine-pitch multi-electrode-pin arrangement in the semiconductor device. Further, it is required that the jig appropriate for the realization of the fine-pitch multi-electronic-pin arrangement in the semiconductor device be manufactured with high accuracy and thus is expensive. Therefore, production efficiency using the jig-used method is low and the production costs are high.

Further, there are problems in the above-described testing step in realization of the fine-pitch multi-electrode-pin arrangement in the semiconductor device. Specifically, the above-described testing step in which the probe pins of the testing apparatus come into contact with the electrode pins directly has problems. This is because each of the probe pins in the ordinary testing apparatus has an outer diameter which is not small enough to match the above-mentioned fine-pitch multi-electrode-pin arrangement of the semiconductor device. That is, if many electrode pins are closely arranged over the entire surface of the semiconductor chip (, such an arrangement may be referred to as 'closely-arranged electrode-pin arrangement', hereinafter), since the diameter of each of the probe pins is not small enough, it is not possible to arrange the probe pins so as to make the probe-pin arrangement match the closely-arranged electrode-pin arrangement of the semiconductor chip. That is, it is not possible to make a pitch between adjacent probe pins of the testing apparatus small enough so it is made the same as a pitch between adjacent electrode pins on the semiconductor chip. Therefore, if the above step for testing the performance of the semiconductor chip is performed on the semiconductor device having the thus closely-arranged electrode-pin arrangement, the probe pins of the ordinary testing apparatus cannot be used. Instead, it is necessary to use an expensive special jig, or the like, for the purpose, thus causing the testing efficiency to be low and thus the production costs to be accordingly high.

SUMMARY OF THE INVENTION

An object of the present invention is to provide a method for manufacturing a semiconductor device having a step of forming the electrode pins on a semiconductor chip using an electrode-pin forming mask, the semiconductor device, the electrode-pin forming mask and a method for testing the semiconductor chip using the electrode-pin forming mask, which enable improvement of production efficiency and testing efficiency and also enable production-cost reduction.

According to the present invention, an electrode pin-forming mask is used to form electrode pins on the semiconductor chip. The electrode pin forming mask has electrode pin-forming holes matching electrode pads previously formed on the semiconductor chip. A screen-printing technique is used to form the electrode pins on the semiconductor chip through the electrode pin-forming mask. That is, conductive material in a paste state is pushed into the electrode pin-forming holes in a condition where the electrode pin-forming mask has been placed on the semiconductor chip and positions of the electrode pin-forming holes match positions of the electrode pads of the semiconductor chip, respectively. The conductor material thus pushed into the electrode pin-forming holes is shaped as to form electrode pins which project from the electrode pads of the semiconductor chip. Then, the electrode pin-forming mask is removed from the semiconductor chip while the thus shaped conductor material continues to be projected from the electrode pads of the semiconductor chip. Thus, the electrode pins are formed on the semiconductor chip.

Thus, it is possible to form a group of the electrode pins easily. Further, it is possible to arbitrarily change the height of the electrode pins simply by changing the thickness of the electrode-pin forming mask.

Further, according to another aspect of the present invention, an in-hole electrode is provided in each of the electrode-pin forming holes. An electrode-connecting wire is drawn out from each in-hole electrode and is electrically connected to a test-purpose electrode. The test-purpose electrode is provided to have a probe pin of a testing apparatus electrically connected thereto to test the semiconductor chip. Thus, the semiconductor chip can be tested via the probe pin.

As a result, it is not necessary to directly connect the probe pin to the electrode pin and the electric connection between the electrode pad and the probe pin is enabled through the electric connection among the electrode pad, in-hole electrode, electrode-connecting wire, test-purpose electrode and the probe pin, in this order. Therefore, it is possible to ensure that the testing is performed even if the semiconductor chip to be tested has many electrode pads in a narrow area.

Further, the above-mentioned semiconductor-chip testing is performed in the semiconductor device manufacturing process, as mentioned above. According to another aspect of the present invention, the testing is performed after the conductor material has been pushed into the electrode-pin forming holes of the electrode-pin forming mask previously placed on the semiconductor chip. The testing is thus performed in parallel with the electrode-pin forming step. Therefore, the semiconductor device manufacturing process can be simplified. Further, the conductive material can help ensure electric connection between the electrode pads and the in-hole electrodes. Thus, the reliability of the testing result can be improved.

Other objects and further features of the present invention will become more apparent from the following detailed description when read in conjunction with the accompanying drawings.

DESCRIPTION OF PREFERRED EMBODIMENTS

Figure 1:
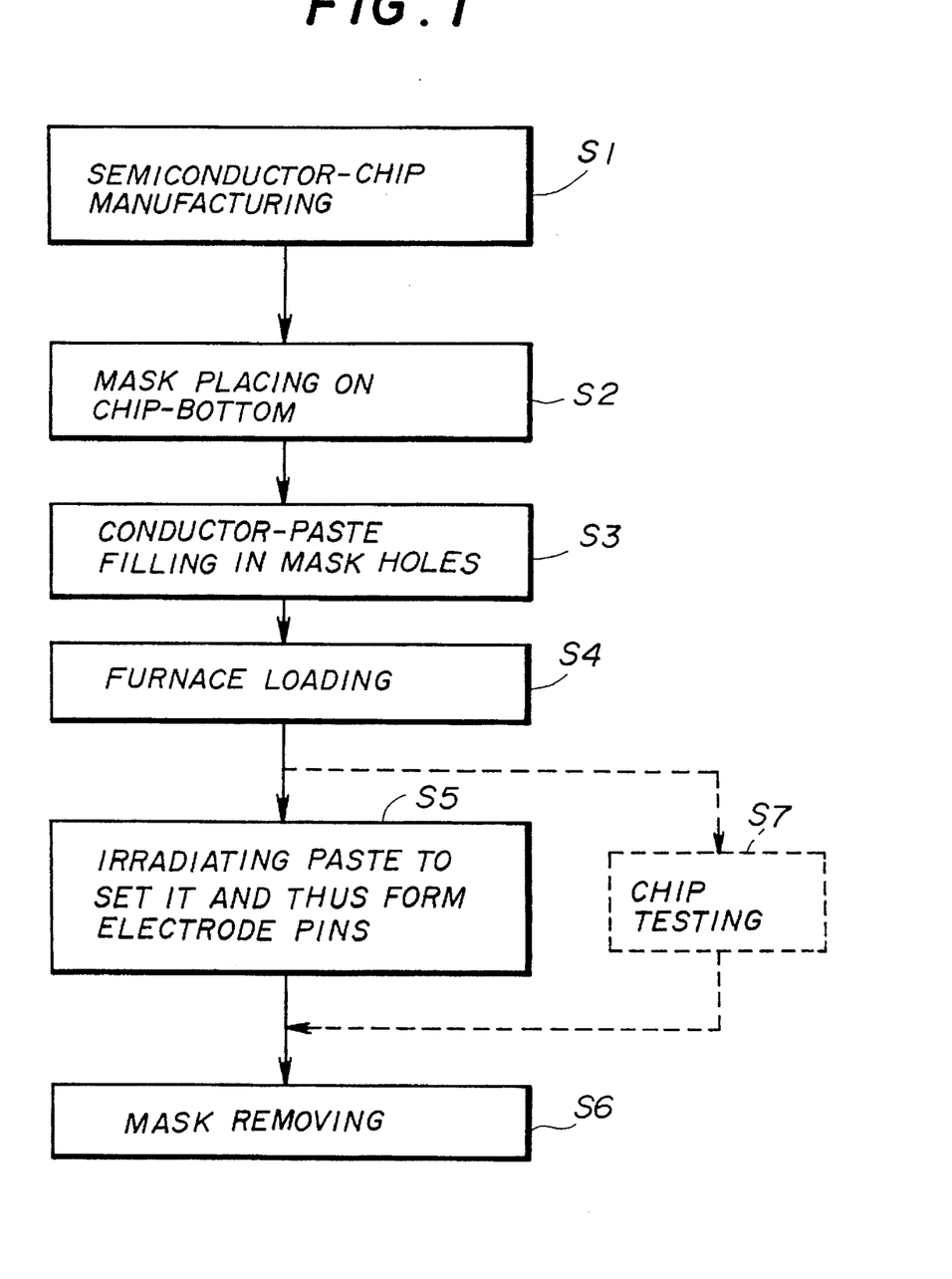
FIG. 1 shows a manufacturing flow of a semiconductor device manufacturing method in one embodiment of the present invention.
Figure 2:
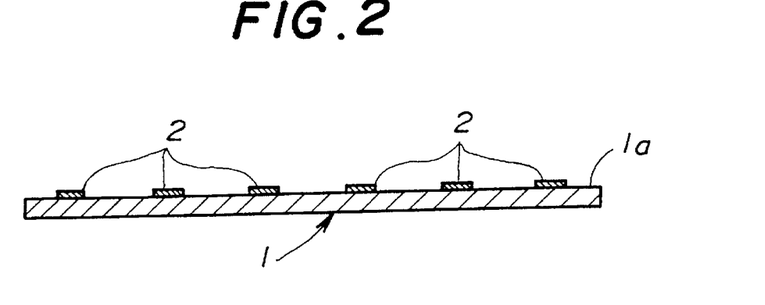
FIG. 2 shows an elevational sectional view of a semiconductor chip with electrode pads in the manufacturing flow shown in FIG. 1.

With reference to FIGS. 1–6, a method for manufacturing a semiconductor device in one embodiment of the present invention will now be described. In order to manufacture a semiconductor device, first a semiconductor chip 1 is manufactured through a well-known semiconductor-chip manufacturing step in a step S1. The term 'step' will be omitted so that, for example, 'a step S1' will be simply referred to as 'S1', hereinafter A plurality of electrode pads 2 are formed on a bottom surface 1a of the semiconductor chip 1, as shown in FIG. 2, in the above-mentioned semiconductor-chip manufacturing step S1. In FIGS. 2–6, since the semiconductor chip 1 is placed in an upsidedown state, the bottom surface 1a faces upward.

Figure 3:
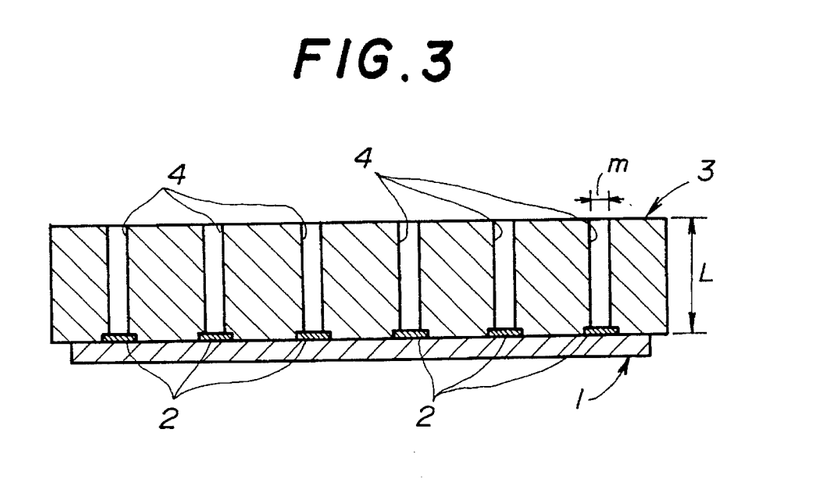
FIG. 3 shows an elevational sectional view of the semiconductor chip and an electrode-pin forming mask placed on the chip in the manufacturing flow shown in FIG. 1.

An electrode-pin forming mask 3 is placed on the bottom surface 1a of the semiconductor chip 1 in S2 as shown in FIG. 3. The mask 3 has therein a plurality of electrode-pin forming holes 4, as shown in the figure. The positions of the holes 4 match positions of the electrode pads 2 formed on the chip 1, respectively. Therefore, each of the holes 4 is aligned with a respective one of the pads 2 at the same time when the mask 3 is placed on the bottom surface 1a, as shown in FIG. 3.

The mask 3 is formed of, for example, stainless steel having superior anticorrosion properties. A thickness L shown in FIG. 3 of the mask 3 is larger than a diameter m of each of the holes 4. Specifically, the diameter m is approximately 100 μm, while the thickness L is approximately 150 μm through 2000 μm.

Figure 4:
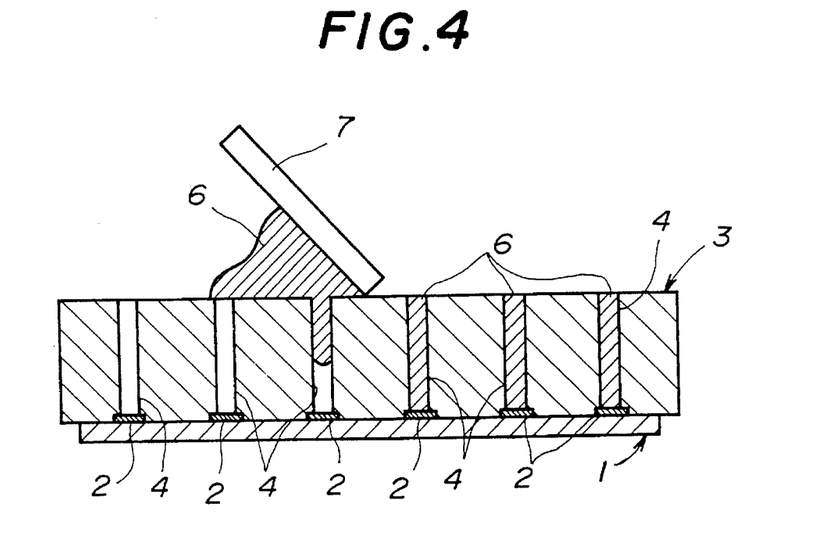
FIG. 4 shows an elevational sectional view of the semiconductor chip and the electrode-pin forming mask placed on the chip, in which mask conductive-material paste is being inserted in the manufacturing flow shown in FIG. 1.
Figure 6:
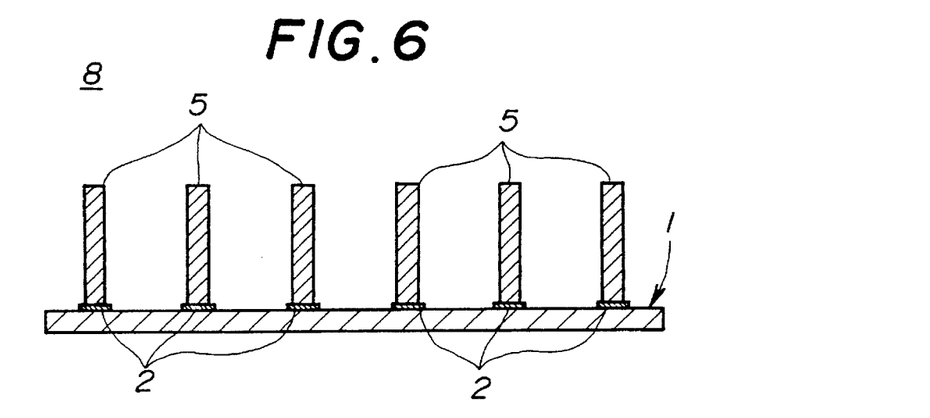
FIG. 6 shows an elevational sectional view of the semiconductor chip and electrode pins formed on the chip in the manufacturing flow shown in FIG. 1.

When using the mask 3 placed on the chip 1 as mentioned above, a screen-printing method is applied in which electrode pins 5 shown in FIG. 6 are formed on the electrode pads 2 as follows: As shown in FIG. 4, each of the holes 4 is filled with conductor-material paste 6 using a squeegee 7 in S3. The conductive paste 6 forms the electrode pins 5 and may be formed of, for example, a mixture of minute particles of highly conductive metal such as gold (Au) or silver (Ag) with epoxy thermosetting resin or light setting resin.

Figure 5:
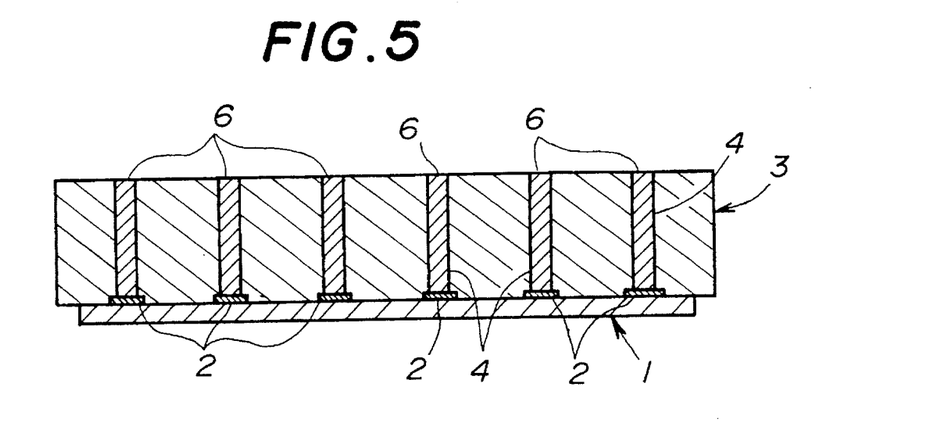
FIG. 5 shows an elevational sectional view of the semiconductor chip and the electrode-pin forming mask placed on the chip, in which mask conductive-material paste has been inserted in the manufacturing flow shown in FIG. 1.

After all of the holes 4 of the mask 3 have been filed with the conductor-material paste 6 in S3 as shown in FIG. 5, the chip 1 is loaded in a heating furnace together with the mask 3 in a state shown in FIG. 5 in S4. Then, infrared rays or light are/is irradiated on the chip 1 in the furnace in S5 so that 80-through-180° C. heat or light is applied to the conductor-material paste 6 with which the holes 4 of the mask 3 placed on the chip 1 are filled. As a result, the conductive-material paste 6 sets or is solidified so as to form the electrode pins 5 shown in FIG. 6. Thus, a semiconductor device 8 is manufactured.

As mentioned above, the thickness L of the mask 3 is larger than the diameter m of each of the holes 4 of the mask 3. As a result, the electrode pins 5 are formed on the chip 1 such that each of the electrode pins 5 has a length L greater than the diameter m of the respective electrode pin 5. Electrode pins having such shapes make an operation in which the semiconductor device is mounted on the mounting substrate easier. Therefore, it is possible to apply the above-mentioned well-known flip-chip-bonding mounting method and TAB mounting method to any semiconductor device 8 manufactured through the method in the embodiment of the present invention described with reference to FIGS. 1–6.

Figure 7:
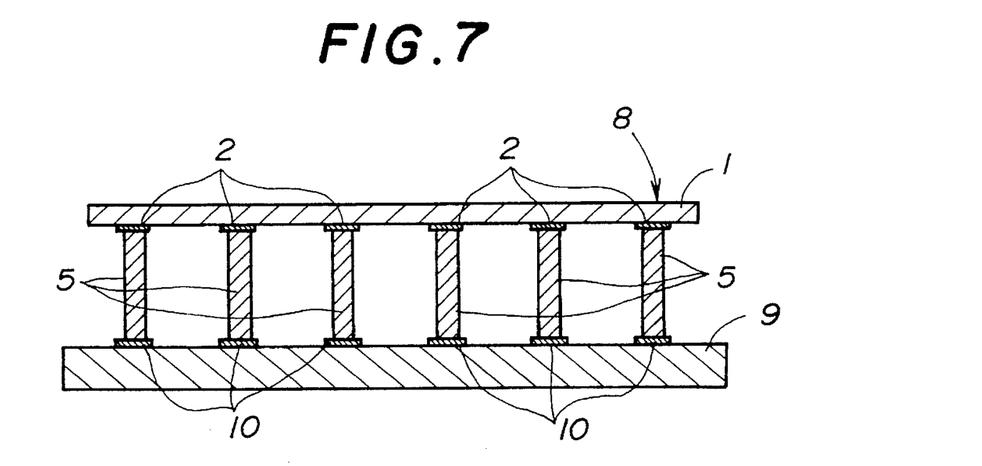
FIG. 7 shows an elevational sectional view of the semiconductor chip with the electrode pins and a mounting substrate bonded with the electrode pins in the manufacturing flow shown in FIG. 1.

The semiconductor device 8 is mounted on a mounting substrate 9 as shown in FIG. 7. The flip-chip-bounding mounting method may be applied to mount the semiconductor device 8 on the mounting substrate 9. That is, bonding pads 10 are formed on the mounting substrate 9 so that positions of the bonding pads on the mounting substrate 9 respectively match positions of the electrode pins 5 projecting from the bottom surface 1a of the chip 1 in the semiconductor device 8. Solder, or the like, is then put on a projecting end of each of the electrode pins 5. The semiconductor device 8 shown in FIG. 6 is then turned upside down and is placed on the mounting substrate 9 so that the projecting ends of the electrode pins 5 come into contact with the bonding pads 10, respectively. After this, the solder, or the like, is heated so that the projecting ends of the electrode pins 5 are bonded onto the bonding pads 10 with the solder, or the like. Thus, the semiconductor device 8 is mounted on the mounting substrate 9.

If a semiconductor device having electrode pins with heights different from one another was used in the flip-chip-bonding mounting method, a problem would occur. That is, some electrode pins would be apart from the respective bonding pads after the mounting process had been completed. As a result, electrical connection between the mounting substrate and semiconductor device would be incomplete. However, in the manufacturing method in the embodiment of the present invention described with reference to FIGS. 1–6, the screen-printing method is applied when using the mask 3 to form the electrode pins 5 on the chip 1 as described above. Therefore, as shown in FIG. 7, the heights of all of the electrode pins 5 formed on the chip 1 are the same as one another. As a result, the above-mentioned problem, in which the electrical connection between the mounting substrate 9 and semiconductor device 8 is incomplete, does not occur. Thus, electrical connection between the mounting substrate 9 and semiconductor device 8 can be ensured.

Further, the screen-printing method is a simple but easy and fast method for forming electrode pins 5 on the chip 1 in a group, the resulting electrode pins 5 having uniform heights. Therefore, applying the screen-printing method results in manufacturing of the semiconductor devices being made easy. Thus, manufacturing-time is reduced, yield-rate improved and product-cost reduced. Further, it is easy to arbitrarily change the height of the electrode pins 5 formed on the semiconductor chip 1 simply by changing the thickness L of the electrode-pin forming mask 3 shown in FIG. 3.

The mixture of minute particles of highly conductive metal with epoxy thermosetting resin or light-setting resin is used as the conductor-material paste 6 in the above embodiment. However, instead of thermosetting resin or light-setting resin, heat-shrinking resin or light-shrinking resin having a 60–90% shrinking rate may be used. By using such resin, it is easy to remove the electrode-pin forming mask 3 from the semiconductor chip 1 in S6 shown in FIG. 1.

Figure 8:
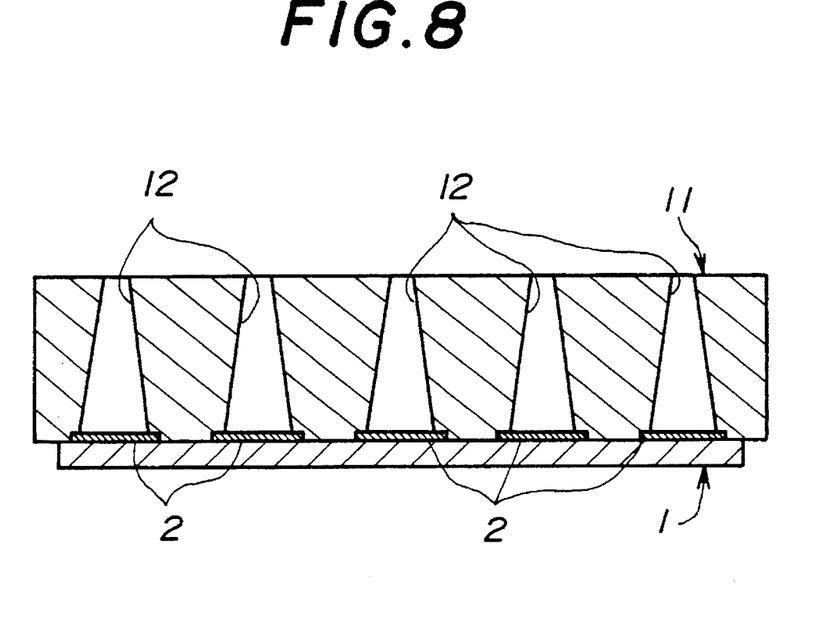
FIG. 8 shows an elevational sectional view of the semiconductor chip and another electrode-pin forming mask placed on the chip in the manufacturing flow shown in FIG. 1.

Another method for making it easier to remove the electrode-pin forming mask 3 from the semiconductor chip 1 will now be described. As shown in FIG. 8, the electrode-pin forming mask 11 has electrode-pin forming holes 12, each of the electrode-pin forming holes 12 tapering off to the bottom thereof as shown in the figure. In other words, the diameter of each hole becomes smaller the closer a position in the hole is to the top thereof. Such a construction makes it easier to remove the electrode-pin forming mask 3 from the semiconductor chip 1.

Figure 9:
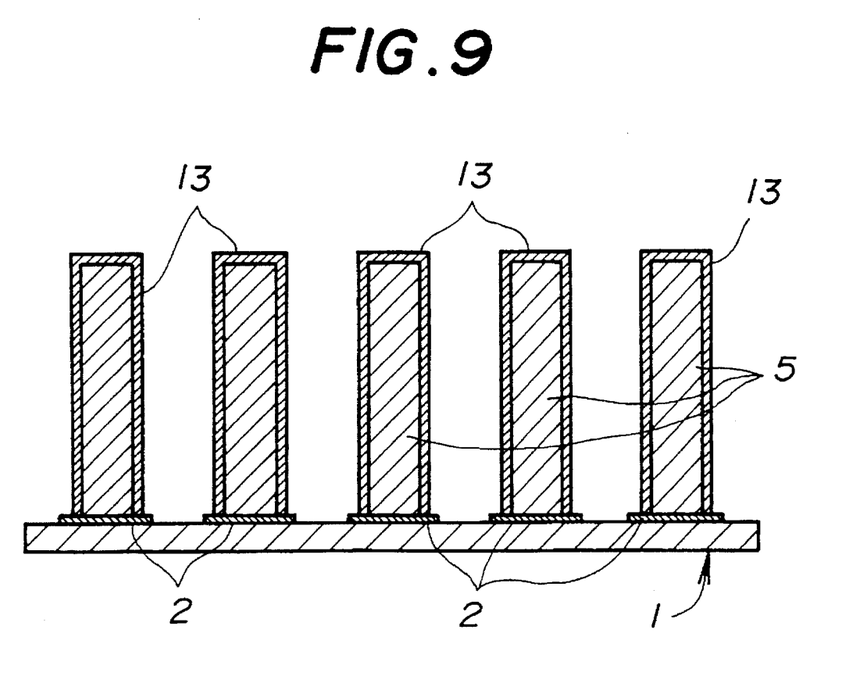
FIG. 9 shows an elevational sectional view of the semiconductor chip and the electrode pins formed on the chip and having highly conductive metal film covering them in the manufacturing flow shown in FIG. 1.

Further, with reference to FIG. 9, highly conductive metal film 13 such as gold (Au) film may be formed on the electrode pins 5 so that each of the electrode pins 5 is covered by the metal film 13. Such film formation may be performed on the semiconductor device 8 which has undergone S6 shown in FIG. 1 in the state shown in FIG. 6. Such provision of metal-film on the electrode pins 5 improves an electric conductive property of the electrode pins 5. In fact, if the semiconductor device 8 is mounted on the mounting substrate 9 as shown in FIG. 7 with the electrode pins 5 which are in a state in which the conductive-material paste 6 has only been hardened through heat or light, since the conductive-material paste 6 is formed of the mixture of the highly conductive metal minute particles with the resin, there is a possibility that the electric conductive property of the electrode pins 5 will be degraded. The construction of the electrode pins 5 shown in FIG. 9 can prevent the degradation of the electric conductive property thereof.

Figure 10:
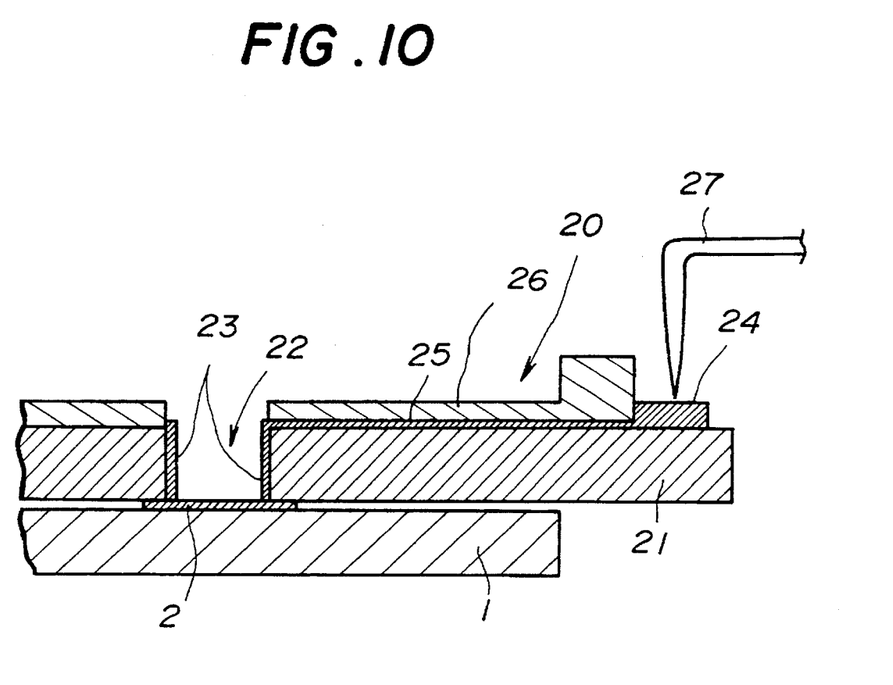
FIG. 10 shows an elevational sectional view of the semiconductor chip and another electrode-pin forming mask placed on the chip in the manufacturing flow shown in FIG. 1.
Figure 11:
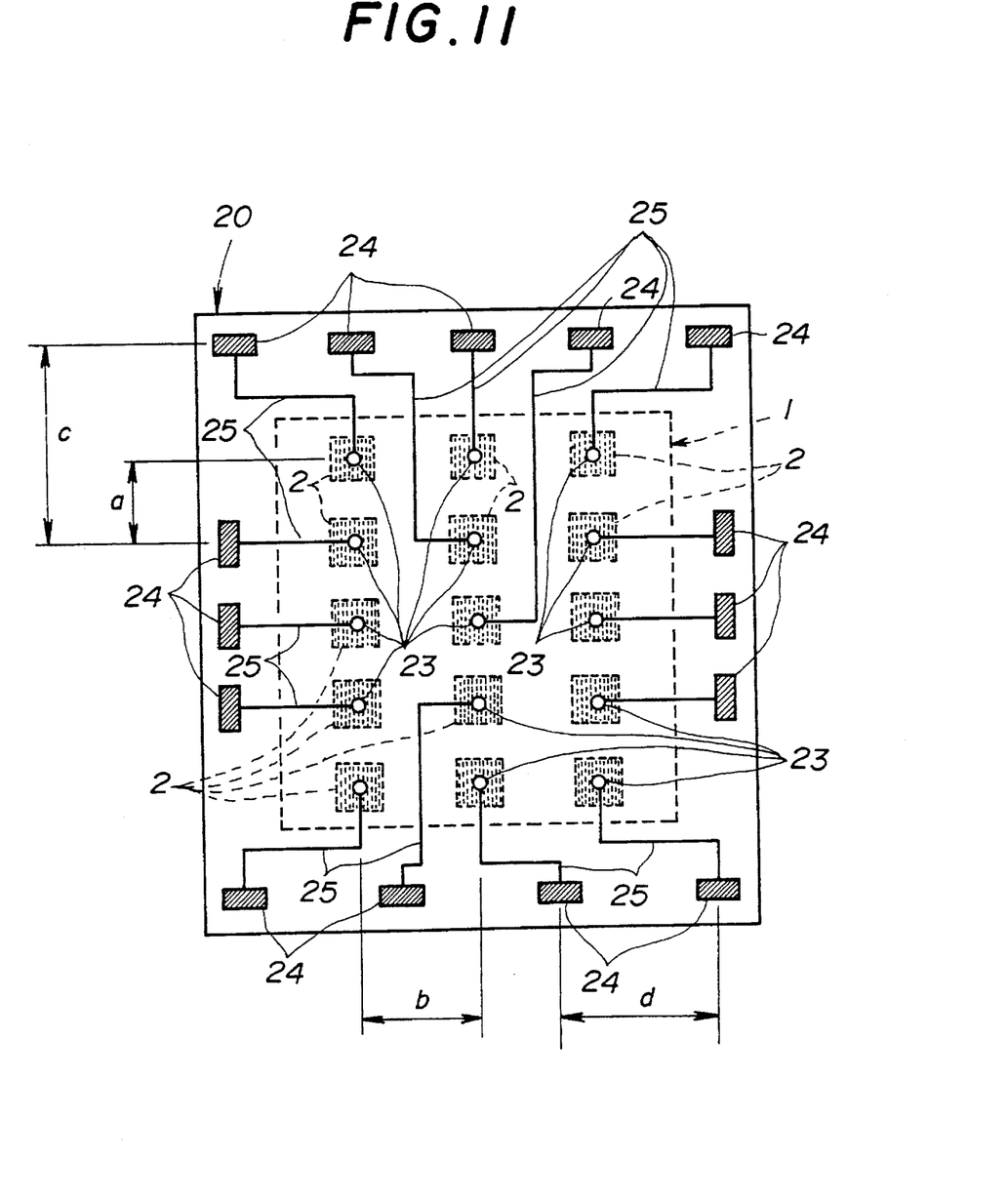
FIG. 11 shows a plan view of the semiconductor chip and the electrode-pin forming mask shown in FIG. 10.

Another embodiment of the electrode-pin forming mask used in S2, S3, S4, S5 and S6 of the semiconductor device manufacturing process shown in FIG. 1 will now be described with reference to FIGS. 10 and 11. A feature of an electrode-pin forming mask 20 in the embodiment shown in FIGS. 10 and 11 is that the mask 20 can be used not only in the electrode-pin forming process but also in an electric test process performed on the semiconductor device 8. FIG. 10 shows a partial magnified sectional view of the semiconductor chip 1 with the electrode-pin forming mask 20 placed on the chip 1. FIG. 11 shows a plan view of the semiconductor chip 1 with the electrode-pin forming mask 20 placed on the chip 1.

The mask 20 includes a mask body 21 formed of insulating resin such as polyimide or the like, electrode-pin forming holes 22 being formed in the mask body 21. Although FIG. 10 shows only one of the holes 22, there are a plurality of the holes 22 in the mask body 21. An in-hole electrode 23 is formed on a wall of each of the holes 22 as shown in FIG. 10. Further, test-purpose electrodes 24 are formed on the top surface of the mask body 21, near to the edge of the surface. Electrode-connecting wires 25 are provided between each of the test-purpose electrodes 24 and a respective one of the above-mentioned in-hole electrodes 23 which are thus electrically connected with each other as shown in FIG. 11. Further, the in-hole electrodes 23 have constructions such that each of the in-hole electrodes 23 comes into contact with and thus is electrically connected with a respective one of the electrode pads 2 formed on the semiconductor chip 1 as shown in FIG. 2.

The above-mentioned in-hole electrodes 23, test-purpose electrodes 24 and electrode-connecting wires 25 are formed as follows: A film is formed by evaporation-depositing or bonding conductive metal layers such as copper-material layers or the like on the walls of the electrode-pin forming holes 22 and on the top surface of the mask body 21. A photolithography technique or the like is used to pattern the thus formed film with predetermined shapes. Gold is plated on the top of the thus patterned film. Thus, the in-hole electrodes 23, test-purpose electrodes 24 and electrode-connecting wires 25 are formed. Further, insulating layers 26 are formed at least on the top of the electrode-connecting wires 25 and thus protect the electrode-connecting wires 25.

In S2-S6 of the semiconductor device manufacturing process shown in FIG. 1, even though the electrode-pin forming mask 20 has the in-hole electrodes 23, test-purpose electrodes 24 and electrode-connecting wires 25 therein, it is used in a way similar to the way in which the electrode-pin forming mask 3 is used and for the same purpose. Thus, description of the use of the mask 20 will be omitted.

Advantages obtained from the electrode-pin forming mask 20 shown in FIGS. 10 and 11 will now be described. In general, the advantages result from drawing out the electrode-connecting wires 25 from the in-hole electrodes 23 to the test-purpose electrodes 24. By this drawing out of the electrode-connecting wires, a long pitch between each adjacent two of the test-purpose electrodes 24 is obtained. That is, the pitch between each adjacent two of the test-purpose electrodes 24 can be longer than a pitch between each adjacent two of the electrode pads 2 provided on the semiconductor chip 1 shown in FIGS. 10 and 11. The pitch between each adjacent two of the in-hole electrodes 23 is the same as that of the electrode pads 2 since the in-hole electrodes 23 are provided for the electrode-pin forming holes 22 which are mated with the electrode pads 2. Therefore, if the pitch between each adjacent two of the electrode pads 2 is short, the pitch between each adjacent two of the in-hole electrodes 23 is short accordingly. However, by drawing out the electrode-connecting wires 25 from the in-hole electrodes 23 to the test-purpose electrodes 24 located near to the outside edge of the mask 20, it is not necessary to connect probe pins 27 directly to the electrode pins 5. Further, it is possible to elongate the pitch between each adjacent two of the electrodes from shorter ones between each adjacent two of the in-hole electrodes 23 to longer ones between each adjacent two of the test-purpose electrodes 24. In fact, with reference to FIG. 11, the vertical pitch between each adjacent two of the electrode pads 2 is a distance 'a' and the horizontal pitch thereof is a distance 'b' while a vertical pitch between each adjacent two of the test-purpose electrodes 24 is a distance 'c' and a horizontal pitch thereof is a distance 'd'. Each of the distances 'c' and 'd' is longer than each of the distances 'a' and 'b'.

The reason why such long pitches between the test-purpose electrodes 24 are advantageous will now be described. As described above, the testing step is included in the semiconductor device manufacturing process, the testing step testing whether or not the manufactured semiconductor chip performs predetermined operations. That is, the testing step uses a testing apparatus (not shown in the drawings) probe pins 27, one of which is shown in FIG. 10, provided in the testing apparatus coming into contact with the test-purpose electrodes 24 as shown in FIG. 10, instead of coming into contact with the electrode pins 5 formed on the electrode pads 2. Thus, electric contact is established between the probe pins and the test-purpose electrodes 24. Further, as described above, the electric connection between the electrode pads 2 and the test-purpose electrodes 24 is established through the electric contact between the electrode pads 2 and the in-hole electrodes 23 and through the electrode-connecting wires 25. As a result, the electric connection between the electrode pads 2 and the probe pins 27 is established. The testing apparatus supplies a power source and testing signals to the semiconductor chip 1 through the thus established electric connection. Thus, the above-mentioned testing of the semiconductor chip 1 is performed.

If the semiconductor chip 1 is one which is highly integrated so as to have many electrode pads 2 in a narrow area (, that is, the semiconductor chip 1 has the above-mentioned fine-pitch multi-electrode-pin arrangement, such a pad arrangement may be referred to as 'fine-pitch multi-electrode-pad arrangement', hereinafter), the above-described electrode-pitch elongation enables even large-diameter probe pins 27 to be used to test the chip 1. As mentioned above, each of the probe pins 27 in the ordinary testing apparatus has an outer diameter which is not small enough to exactly match the fine-pitch multi-electrode-pad arrangement of the semiconductor chip 1, which will form the fine-pitch multi-electrode-pin arrangement of the semiconductor device 8. However, it is possible to elongate the electrode pitches as described above, using the electrode-pin forming mask 20. Therefore, if many electrode pads 2 are closely arranged over the entire surface of the semiconductor chip 1, it is possible to draw out the electrode-connecting wires 25 from the electrode pads 2 to the test-purpose electrodes 24 having the elongated pitches. As a result, even if the diameter of each of the probe pins 27 is not small enough, it is possible to arrange the probe pins 27 so as to make the probe-pin arrangement match the elongated-pitch arranged test-purpose electrodes 24 of the electrode-pin forming mask 20. Therefore, if the semiconductor-chip performance testing is performed on the semiconductor device 8 which will have the thus closely-arranged electrode-pin arrangement, the probe pins 27 of the ordinary testing apparatus can be used. Thus, it is not necessary to use an expensive special jig or the like for this purpose. Thus, the testing step can be performed surely and economically even if the highly integrated semiconductor chip 1 is tested.

The above-described testing step may be performed after S3 shown in FIG. 1 in which step the electrode-pin forming holes 22 are filled with the conductive-material paste 6. That is, the probe pins 27 are connected to the test-purpose electrodes 24 after the holes 22 have been filled with the paste 6 which will form the electrode pins 5. In such a way, the semiconductor-chip testing step S7 can be performed at the same time as the electrode-pin forming step, that is, S5 as shown in FIG. 1. Therefore, the semiconductor device manufacturing step can be simplified. Further, since the testing step is performed in the state in which the electrode-pin forming holes 22 are filled with the conductive-material paste 6, the conductive-material paste 6 can help to ensure electric connection between the electrode pads 2 and the in-hole electrodes 23. Thus, the reliability of the testing result can be improved.

Figure 12:
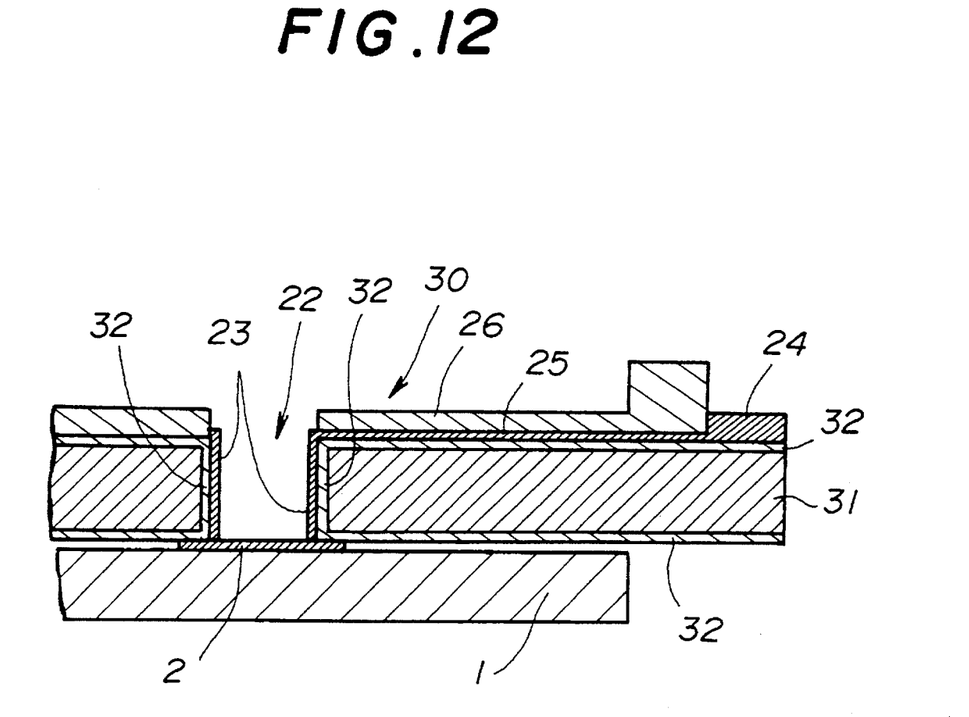
FIG. 12 shows an elevational sectional view of the semiconductor chip and another electrode-pin forming mask serving as a variant of that shown in FIG. 10.

With reference to FIG. 12, an example of a variant of the electrode-pin forming mask 20 will now be described. The same reference numerals as those of the mask 20 are given to those elements of an electrode-pin forming mask 30 which correspond to those of the mask 20, and a description thereof will be omitted.

A feature of the electrode-pin forming mask 30 shown in FIG. 12 is that the mask 30 includes a mask body 31 formed of metal such as, for example, stainless steel, instead of the mask body 21 formed of resin of the mask 20 shown in FIG. 10. If the mask body is formed of resin as in the case of the mask body 21, thermal expansion of the mask body due to the irradiating step S5 shown in FIG. 1 may degrade accuracy of the mask as a die and/or may degrade mechanical strength of the mask. In contrast to this, using metal such as stainless steel which has a low thermal-expansion rate and special mechanical strength eliminates the above problems. It is necessary to prevent an electric connection from being established between the electrode-connecting wires 25 and the mask body 31 and thus prevent electric connection among the electrode pads 2. For this purpose, insulating layers 32 are formed on the top and bottom surfaces of and walls of the electrode-pin forming holes 22 of the mask body 31. The insulating layers 32 may be formed of polyimide resin or the like. The insulating layers 32 prevent the electrode-connecting wires 25, in-hole electrodes 23, electrode pads 2 and top surface of the semiconductor chip 1, respectively, from coming into direct contact with the mask body 31 formed of metal, which is a generally electric conductive material.

Further, the present invention is not limited to the above-described embodiments, and variations and modifications may be made without departing from the scope of the present invention.

What is claimed is:

1. A semiconductor device comprising:

a semiconductor chip having electrode pads thereon; and electrode pins formed of a hardened mixture of minute particles of highly conductive metals and epoxy resin projecting from a respective one of said electrode pads of said semiconductor chip.

2. The semiconductor device according to claim 1, wherein said electrode pins have highly conductive metal film formed thereon so that each of said electrode pins is covered by said metal film.

3. The semiconductor device according to claim 1, wherein each of said electrode pins has a generally cylindrical shape.

4. The semi-conductor device according to claim 3 wherein a projecting height of each of said electrode pins is greater than a diameter thereof.

5. The semiconductor device according to claim 1, wherein each of said electrode pins has a tapered shape such that a diameter of each pin becomes smaller the higher a position in said pin is.

6. The semi-conductor device according to claim 1, wherein said epoxy resin is a thermo-setting resin.

7. The semi-conductor device according to claim 1, wherein said epoxy resin is a light-setting resin.

* * * * *